(12) United States Patent
Maeda et al.

(10) Patent No.: US 12,613,463 B2
(45) Date of Patent: *Apr. 28, 2026

(54) MASK BLANK, AND PHASE SHIFT MASK

(71) Applicant: HOYA CORPORATION, Tokyo (JP)

(72) Inventors: Hitoshi Maeda, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 330 days.

This patent is subject to a terminal disclaimer.

(21) Appl. No.: 18/278,310

(22) PCT Filed: Jan. 21, 2022

(86) PCT No.: PCT/JP2022/002156
§ 371 (c)(1),
(2) Date: Aug. 22, 2023

(87) PCT Pub. No.: WO2022/201816
PCT Pub. Date: Sep. 29, 2022

(65) Prior Publication Data
US 2024/0184194 A1    Jun. 6, 2024

(30) Foreign Application Priority Data
Mar. 23, 2021    (JP) ................................. 2021-048833

(51) Int. Cl.
*G03F 1/32*    (2012.01)
(52) U.S. Cl.
CPC .................................... *G03F 1/32* (2013.01)

(58) Field of Classification Search
CPC ................. G03F 1/32; G03F 1/54; G03F 1/80
See application file for complete search history.

(56) References Cited

U.S. PATENT DOCUMENTS

| | | | |
|---|---|---|---|
| 2002/0122991 A1 | 9/2002 | Shiota et al. | |
| 2003/0180631 A1* | 9/2003 | Shiota | G03F 1/32 |
| | | | 428/432 |
| 2009/0075185 A1 | 3/2009 | Okubo et al. | |
| 2018/0149961 A1* | 5/2018 | Nozawa | G03F 1/54 |
| 2019/0064651 A1* | 2/2019 | Shishido | C23C 14/06 |
| 2020/0409252 A1 | 12/2020 | Taniguchi et al. | |

(Continued)

FOREIGN PATENT DOCUMENTS

| | | |
|---|---|---|
| JP | 07-209849 A | 8/1995 |
| JP | H07325384 A | 12/1995 |

(Continued)

OTHER PUBLICATIONS

PCT/JP2022/002156, "English Translation of International Search Report", Mar. 15, 2022, 2 pages.

(Continued)

*Primary Examiner* — Stewart A Fraser
(74) *Attorney, Agent, or Firm* — Sughrue Mion, PLLC

(57) ABSTRACT

A mask blank comprises a transparent substrate and a phase shift film on the transparent substrate. The phase shift film includes a lower layer and an upper layer formed on the lower layer. The upper layer is in contact with the lower layer. The lower layer includes silicon and oxygen. The upper layer includes hafnium and oxygen. The upper layer has a thickness of 5 nm or more. The phase shift film has a thickness of 90 nm or less.

20 Claims, 3 Drawing Sheets

(56)                 References Cited

U.S. PATENT DOCUMENTS

2021/0026235 A1*  1/2021  Maeda ................ H01L 21/0337
2022/0252972 A1      8/2022  Maeda et al.
2023/0314929 A1*  10/2023  Maeda ...................... G03F 1/54
                                                                    430/5

FOREIGN PATENT DOCUMENTS

| JP | H08171197 | A | 7/1996 |
| JP | 2002258460 | A | 9/2002 |
| JP | 2012083521 | A | 4/2012 |
| KR | 10-2009-0028470 | A | 3/2009 |
| KR | 10-2020-0123119 | A | 10/2020 |
| WO | 2021044917 | A1 | 3/2021 |

OTHER PUBLICATIONS

Notification of Reason for Refusal dated Nov. 7, 2025 in counterpart
Korean Application No. 10-2023-7030073.

* cited by examiner

FIG. 2E
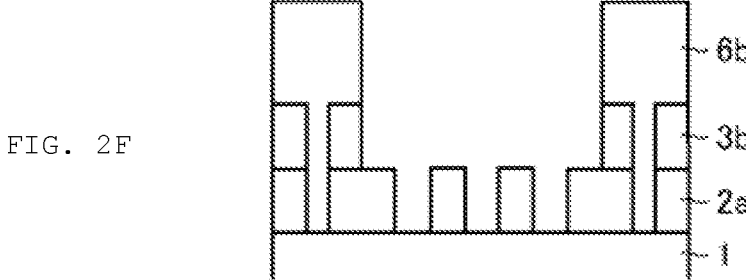
FIG. 2F
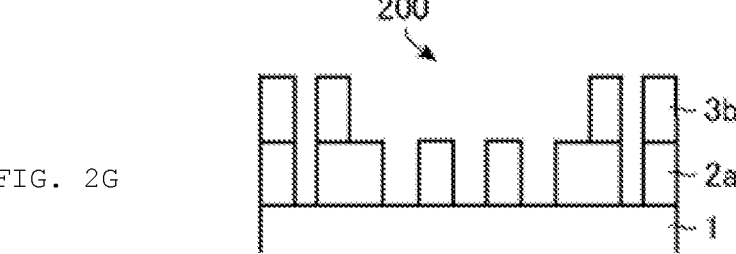
FIG. 2G

MASK BLANK, AND PHASE SHIFT MASK

CROSS-REFERENCE TO RELATED APPLICATIONS

This application is the National Stage of International Application No. PCT/JP2022/002156, filed Jan. 21, 2022, which claims priority to Japanese Patent Application No. 2021-048833, filed Mar. 23, 2021, and the contents of which is incorporated by reference.

TECHNICAL FIELD

The present disclosure relates to a mask blank for a phase shift mask, a phase shift mask, and a method of manufacturing a semiconductor device.

BACKGROUND ART

In a semiconductor device manufacturing process, a fine pattern is formed using a photolithography method. Many transfer masks are usually used for forming the fine pattern. In order to miniaturize the pattern of the semiconductor device, it is necessary to miniaturize a mask pattern formed on the transfer mask and to shorten a wavelength of an exposure light source used in photolithography.

As such a photomask, Patent Document 1 discloses a dielectric mask including a transparent substrate 1 capable of transmitting laser light, a metal film 17 layered on a surface of the transparent substrate 1 and having high reflectance to laser light, a dielectric multilayer thin film 4 formed by alternately building up first and second dielectric members 2 and 3 having different refractive indexes on the metal film 17, and a plurality of openings 18 that are formed through the dielectric multilayer thin film 4 and the metal film 17 and arranged in a predetermined pattern. Patent Document 2 discloses a mask for excimer laser processing having a structure in which a third dielectric layer 1' is included on an uppermost layer of a dielectric multilayer film obtained by repeatedly forming a combination of bilayer films obtained by building up a first dielectric layer 1 and a second dielectric layer 2 on a surface of a glass substrate 3 opposite to an ultraviolet light incident side and a metal film 4 is formed on the uppermost layer, the glass substrate 3 being transparent to ultraviolet light, the first dielectric layer 1 having a film thickness with an optical path length of ¼ wavelength of ultraviolet light to be used, the second dielectric layer 2 having an optical path length of ¼ wavelength and a refractive index smaller than that of the first dielectric layer, the third dielectric layer 1' having a refractive index larger than the refractive index of the glass substrate and having an optical path length of ¼ wavelength of ultraviolet light to be used.

In Patent Documents 1 and 2, a KrF excimer laser (wavelength: 248 nm) is mainly applied to an exposure light source when a semiconductor device is manufactured. However, in recent years, an ArF excimer laser (wavelength: 193 nm) has been increasingly applied to an exposure light source when a semiconductor device is manufactured.

One type of a transfer mask is a halftone phase shift mask. As a mask blank for the halftone phase shift mask, there has been known a mask blank having a structure in which a phase shift film formed of a material containing silicon and nitrogen, a light-shielding film formed of a chromium-based material, and an etching mask film (hard mask film) formed of an inorganic material are layered on a transparent substrate. In a case where the halftone phase shift mask is manufactured using this mask blank, first, an etching mask film is patterned by dry etching with a fluorine-based gas using a resist pattern formed on a surface of the mask blank as a mask, then a light-shielding film is patterned by dry etching with a mixed gas of chlorine and oxygen using the etching mask film as a mask, and furthermore, a phase shift film is patterned by dry etching with a fluorine-based gas using the pattern of the light-shielding film as a mask.

PRIOR ART DOCUMENTS

Patent Documents

Patent Document 1: JP H07-325384 A
Patent Document 2: JP H08-171197 A

SUMMARY OF DISCLOSURE

Technical Problem

In recent years, with miniaturization and complication of a pattern, it is required to enable pattern transfer with higher resolution. In order to achieve such pattern transfer with high resolution, it is effective to increase a transmittance of a phase shift film. As such a phase shift film, a configuration containing hafnium, silicon, and oxygen has been studied.

When a transfer pattern is formed on the phase shift film, a cleaning treatment using an acid or an alkali is performed. However, it has been found that the phase shift film containing hafnium, silicon, and oxygen does not have sufficient cleaning resistance (chemical resistance) against an acid or an alkali in some cases.

The present disclosure has been made in order to solve a conventional problem, and an aspect of the present disclosure is to provide a mask blank capable of manufacturing a phase shift mask that sufficiently satisfies required cleaning resistance and chemical resistance and has good optical performance. Another aspect of the present disclosure is to provide a phase shift mask that sufficiently satisfies required cleaning resistance and chemical resistance and has good optical performance. In addition, the present disclosure provides a method of manufacturing a semiconductor device using such a phase shift mask.

Solution to Problem

The present disclosure has the following configurations as means for solving the above problems.
(Configuration 1)
A mask blank comprising a phase shift film on a transparent substrate, in which
  the phase shift film includes a lower layer and an upper layer,
  the upper layer is formed in contact with a surface of the lower layer opposite to the transparent substrate,
  the lower layer includes silicon and oxygen,
  the upper layer includes hafnium and oxygen,
  the upper layer has a thickness of 5 nm or more, and
  the phase shift film has a thickness of 90 nm or less.
(Configuration 2)
  The mask blank according to configuration 1, in which a total content of hafnium and oxygen in the upper layer is 90 atom % or more.
(Configuration 3)
  The mask blank according to configuration 1 or 2, in which a total content of silicon and oxygen in the lower layer is 90 atom % or more.

(Configuration 4)

The mask blank according to any one of configurations 1 to 3, in which a content of oxygen in each of the lower layer and the upper layer is 50 atom % or more.

(Configuration 5)

The mask blank according to any one of configurations 1 to 4, in which the phase shift film includes a lowermost layer between the transparent substrate and the lower layer, the lowermost layer is formed in contact with a surface of the lower layer on the transparent substrate side, and the lowermost layer includes hafnium and oxygen.

(Configuration 6)

The mask blank according to configuration 5, in which the lowermost layer has a thickness of 5 nm or more.

(Configuration 7)

The mask blank according to configuration 5 or 6, in which a total content of hafnium and oxygen in the lowermost layer is 90 atom % or more.

(Configuration 8)

The mask blank according to any one of configurations 5 to 7, in which a content of oxygen in the lowermost layer is 50 atom % or more.

(Configuration 9)

The mask blank according to any one of configurations 1 to 8, in which the lower layer has a thickness of 5 nm or more.

(Configuration 10)

The mask blank according to any one of configurations 1 to 9, in which the phase shift film has a function of transmitting exposure light of an ArF excimer laser with a transmittance of 20% or more, and a function of generating a phase difference of 150 degrees or more and 210 degrees or less between the exposure light that has passed through the phase shift film and the exposure light that has passed through air by the same distance as the thickness of the phase shift film.

(Configuration 11)

The mask blank according to any one of configurations 1 to 10, comprising a light-shielding film on the phase shift film.

(Configuration 12)

A phase shift mask comprising a phase shift film having a transfer pattern formed on a transparent substrate, in which the phase shift film includes a lower layer and an upper layer, the upper layer is formed in contact with a surface of the lower layer opposite to the transparent substrate, the lower layer includes silicon and oxygen, the upper layer includes hafnium and oxygen, the upper layer has a thickness of 5 nm or more, and the phase shift film has a thickness of 90 nm or less.

(Configuration 13)

The phase shift mask according to configuration 12, in which a total content of hafnium and oxygen in the upper layer is 90 atom % or more.

(Configuration 14)

The phase shift mask according to configuration 12 or 13, in which a total content of silicon and oxygen in the lower layer is 90 atom % or more.

(Configuration 15)

The phase shift mask according to any one of configurations 12 to 14, in which a content of oxygen in each of the lower layer and the upper layer is 50 atom % or more.

(Configuration 16)

The phase shift mask according to any one of configurations 12 to 15, in which the phase shift film includes a lowermost layer between the transparent substrate and the lower layer, the lowermost layer is formed in contact with a surface of the lower layer on the transparent substrate side, and the lowermost layer includes hafnium and oxygen.

(Configuration 17)

The phase shift mask according to configuration 16, in which the lowermost layer has a thickness of 5 nm or more.

(Configuration 18)

The phase shift mask according to configuration 16 or 17, in which a total content of hafnium and oxygen in the lowermost layer is 90 atom % or more.

(Configuration 19)

The phase shift mask according to any one of configurations 16 to 18, in which a content of oxygen in the lowermost layer is 50 atom % or more.

(Configuration 20)

The phase shift mask according to any one of configurations 12 to 19, in which the lower layer has a thickness of 5 nm or more.

(Configuration 21)

The phase shift mask according to any one of configurations 12 to 20, in which the phase shift film has a function of transmitting exposure light of an ArF excimer laser with a transmittance of 20% or more, and a function of generating a phase difference of 150 degrees or more and 210 degrees or less between the exposure light that has passed through the phase shift film and the exposure light that has passed through air by the same distance as the thickness of the phase shift film.

(Configuration 22)

The phase shift mask according to any one of configurations 12 to 21, comprising, on the phase shift film, a light-shielding film on which a light-shielding pattern is formed.

(Configuration 23)

A method of manufacturing a semiconductor device, the method comprising transferring the transfer pattern, by exposure, to a resist film on a semiconductor substrate using the phase shift mask according to any one of configurations 12 to 22.

Advantageous Effects of Disclosure

A mask blank of the present disclosure having the above configurations includes a phase shift film on a transparent substrate, in which the phase shift film includes a lower layer and an upper layer, the upper layer is formed in contact with a surface of the lower layer opposite to the transparent substrate, the lower layer contains silicon and oxygen, the upper layer contains hafnium and oxygen, the upper layer has a thickness of 5 nm or more, and the phase shift film has a thickness of 90 nm or less. Therefore, a phase shift mask that sufficiently satisfies required cleaning resistance and chemical resistance and has good optical performance can be manufactured. Furthermore, in manufacture of a semiconductor device using this phase shift mask, it is possible to accurately transfer a pattern to a resist film and the like on the semiconductor device.

BRIEF DESCRIPTION OF DRAWINGS

FIGS. 2A-2G are schematic cross-sectional views illustrating a process of manufacturing a phase shift mask of the first embodiment.

DESCRIPTION OF EMBODIMENT

Figure 1:
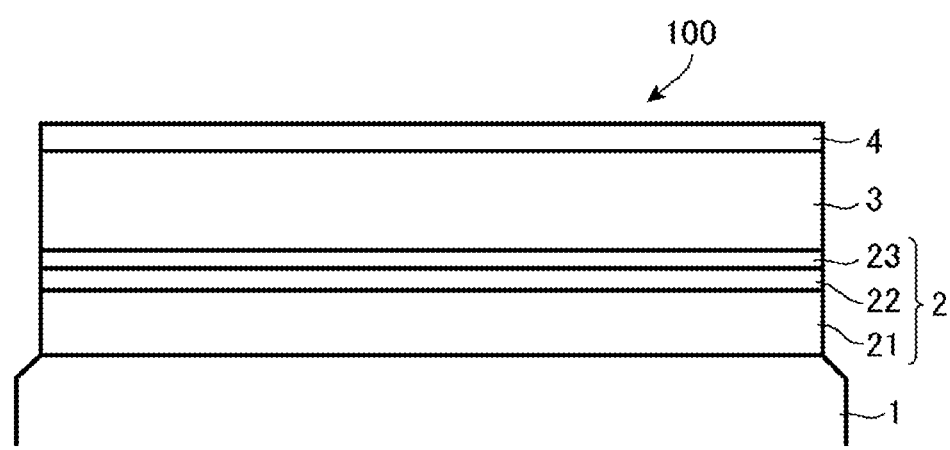
FIG. 1 is a schematic cross-sectional view of a mask blank of a first embodiment.

Hereinafter, an embodiment of the present disclosure will be described. The inventors of the present application have intensively conducted studies on a phase shift film containing hafnium, silicon, and oxygen and having a configuration capable of increasing a transmittance with respect to exposure light of an ArF excimer laser (hereinafter, also simply referred to as exposure light) to a certain level or more (for example, 20% or more) to enhance a phase shift effect, capable of controlling a film thickness of the phase shift film to a certain level or less (for example, 90 nm or less), and having good optical performance.

The phase shift film needs to have both a function of transmitting exposure light with a predetermined transmittance and a function of generating a predetermined phase difference between exposure light passing through the phase shift film and exposure light passing through air by the same distance as the thickness of the phase shift film. When an attempt is made to control the film thickness of the phase shift film to a certain level or less, it is difficult to secure a desired phase difference. A phase shift film having a single-layer structure has a problem that a degree of freedom in design is low.

Therefore, the inventors of the present application have studied that the phase shift film has at least a two-layer structure. In addition, the inventors have found that, when the phase shift film includes a lower layer and an upper layer from a transparent substrate side, by adopting a configuration in which the upper layer contains hafnium and oxygen and the lower layer contains silicon and oxygen, a desired phase difference can be secured and a film thickness can be controlled not to be large. A thin film containing hafnium and oxygen has an optical characteristic in which a refractive index $n$ with respect to exposure light is significantly large but an extinction coefficient $k$ is relatively small. A thin film containing silicon and oxygen has an optical characteristic in which the refractive index $n$ with respect to exposure light is relatively small but the extinction coefficient $k$ is significantly small. However, it has been found that cleaning resistance and chemical resistance against an acid or an alkali are not sufficient in some cases only under this condition. A material itself containing hafnium and oxygen is considered to be a material having high cleaning resistance and chemical resistance, and it was initially considered that sufficient cleaning resistance and chemical resistance could be obtained by forming the upper layer with the material containing hafnium and oxygen.

The present inventors have further conducted studies, and found that the thickness of the above-described upper layer is important in order to sufficiently satisfy required cleaning resistance and chemical resistance. That is, the present inventors have found that the thickness of the above-described upper layer needs to be 5 nm or more in order to sufficiently satisfy required cleaning resistance and chemical resistance.

The present inventors presume a reason for this as follows.

In manufacture of a phase shift mask blank, a phase shift film is formed on a transparent substrate by a sputtering method. In a case where the sputtering method is used, it is difficult to form a thin film with a stoichiometrically stable metal oxide. That is, even when a $SiO_2$ target is used as a target of the lower layer and a $HfO_2$ target is used as a target of the above-described upper layer, it is difficult to form each of the layers formed by the sputtering method with stoichiometrically stable $SiO_2$ or $HfO_2$. Therefore, both the lower layer and the upper layer are likely to be in a state where the content of oxygen is less than a stoichiometrically stable oxygen content, that is, in a state in which oxygen deficiency occurs. In addition, it is presumed that some atoms in the upper layer and the lower layer are likely to move, due to the oxygen deficiency, to cause mutual diffusion near an interface between the upper layer and the lower layer, which results in silicon partially mixed into the upper layer containing hafnium and oxygen.

In addition, a certain degree of internal stress is generated in a thin film formed by the sputtering method. When the internal stress of the thin film is high, positional deviation may occur when a pattern is formed on the thin film. For this reason, the thin film after film formation is often subjected to an annealing treatment. While the internal stress can be reduced by this annealing treatment, it is considered that the above-described mutual diffusion between the upper layer and the lower layer is promoted.

Because of these, when the thickness of the upper layer containing hafnium and oxygen is less than 5 nm, silicon is mixed into a surface layer region of the upper layer to cause the entire upper layer to contain hafnium, oxygen, and silicon. It is presumed that this significantly reduces cleaning resistance and chemical resistance. That is, in order to prevent such a situation, it is presumed that the thickness of the upper layer needs to be 5 nm or more.

The present disclosure has been made on the basis of the above findings. Note that this presumption is based on current knowledge of the present inventors, and does not limit the scope of rights of the present disclosure at all.

Hereinafter, a detailed configuration of the present disclosure described above will be described with reference to the drawings. Note that, in the drawings, similar components are denoted by the same reference numerals to be described.

First Embodiment

FIG. 1 illustrates a schematic configuration of a mask blank of a first embodiment. A mask blank 100 illustrated in FIG. 1 has a configuration in which a phase shift film 2, a light-shielding film 3, and a hard mask film 4 are layered in this order on one main surface of a transparent substrate 1. The mask blank 100 may have a configuration without the hard mask film 4 as necessary. The mask blank 100 may also have a configuration in which a resist film is layered on the hard mask film 4 as necessary. Hereinafter, details of main components of the mask blank 100 will be described.

[Transparent Substrate]

The transparent substrate 1 is formed of a material having good transparency with respect to exposure light used in an exposure step in lithography. As such a material, synthetic quartz glass, aluminosilicate glass, soda lime glass, low thermal expansion glass ($SiO_2$—$TiO_2$ glass and the like), and other various glass substrates can be used. In particular, a substrate using synthetic quartz glass has high transparency to ArF excimer laser light (wavelength: about 193 nm), and therefore can be suitably used as the transparent substrate 1 of the mask blank 100.

Note that, the exposure step in lithography as used herein is an exposure step in lithography using a phase shift mask prepared using the mask blank 100, and the exposure light refers to ArF excimer laser light (wavelength: 193 nm) unless otherwise specified.

A refractive index of the material forming the transparent substrate 1 with respect to the exposure light is preferably 1.5 or more and 1.6 or less, more preferably 1.52 or more and 1.59 or less, and still more preferably 1.54 or more and 1.58 or less.

[Phase Shift Film]

In order to obtain an appropriate phase shift effect, the phase shift film 2 is preferably adjusted so as to have a function of generating a phase difference of 150 degrees or more and 210 degrees or less between exposure light that has passed through the phase shift film 2 and the exposure light that has passed through air by the same distance as the thickness of the phase shift film 2. The phase difference in the phase shift film 2 is more preferably 155 degrees or more, and still more preferably 160 degrees or more. On the other hand, the phase difference in the phase shift film 2 is more preferably 195 degrees or less, and still more preferably 190 degrees or less.

In order to generate a sufficient phase shift effect between the exposure light that has passed through the inside of the phase shift film 2 and the exposure light that has passed through air, the phase shift film 2 preferably has a high transmittance to some extent. Specifically, the phase shift film 2 preferably has a function of transmitting the exposure light with a transmittance of 20% or more, more preferably 30% or more. This is for generating a sufficient phase shift effect between the exposure light that has passed through the inside of the phase shift film 2 and the exposure light that has passed through air. The transmittance of the phase shift film 2 with respect to the exposure light is preferably 60% or less, and more preferably 50% or less. This is for controlling the film thickness of the phase shift film 2 in an appropriate range in which optical performance can be secured.

The phase shift film 2 in the present embodiment has a structure in which a lowermost layer 21, a lower layer 22, and an upper layer 23 are layered from the transparent substrate 1 side.

In order to secure optical performance, the film thickness of the phase shift film 2 is preferably 90 nm or less, more preferably 80 nm or less, and still more preferably 70 nm or less. In addition, in order to secure a function of generating a desired phase difference, the film thickness of the phase shift film 2 is preferably 45 nm or more, and more preferably 50 nm or more.

The upper layer 23 preferably contains hafnium and oxygen, and more preferably consists of hafnium and oxygen. Here, the phrase "consists of hafnium and oxygen" refers to a material containing, in addition to these constituent elements, only elements (a noble gas such as helium (He), neon (Ne), argon (Ar), krypton (Kr), or xenon (Xe), hydrogen (H), carbon (C), and the like) that are inevitably contained in the upper layer 23 when a film is formed by the sputtering method (the same applies to description of "consists of silicon and oxygen" in the lower layer 22 described later). By minimizing presence of other elements that are bonded to hafnium in the upper layer 23, a ratio of bonds of hafnium and oxygen in the upper layer 23 can be significantly increased.

Therefore, a total content of hafnium and oxygen in the upper layer 23 is preferably 90 atom % or more, more preferably 95 atom % or more, still more preferably 98 atom % or more, and further still more preferably 99 atom % or more. The content of oxygen in the upper layer 23 is preferably 50 atom % or more, more preferably 55 atom % or more, and still more preferably 60 atom % or more. In addition, from a viewpoint of an etching rate, the content of oxygen in the upper layer 23 is preferably 66 atom % or less in which oxygen deficiency occurs, and more preferably 65 atom % or less.

A total content of the above elements (a noble gas, hydrogen, carbon, and the like) inevitably contained in the upper layer 23 is preferably 3 atom % or less.

The refractive index n of the upper layer 23 with respect to the exposure light is preferably 3.1 or less, and more preferably 3.0 or less. The refractive index n of the upper layer 23 is preferably 2.5 or more, and more preferably 2.6 or more. In contrast, the extinction coefficient k of the upper layer 23 with respect to the exposure light is preferably 0.4 or less. This is for increasing the transmittance of the phase shift film 2 with respect to the exposure light. The extinction coefficient k of the upper layer 23 is preferably 0.05 or more, more preferably 0.1 or more, and still more preferably 0.2 or more.

From a viewpoint of chemical resistance and cleaning resistance, the thickness of the upper layer 23 is preferably 5 nm or more, and more preferably 6 nm or more. From a viewpoint of an optical characteristic, the thickness of the upper layer 23 is preferably 30 nm or less, more preferably 20 nm or less, and still more preferably 15 nm or less. As described above, in a case where the thickness of the upper layer 23 containing hafnium and oxygen is less than 5 nm, mutual diffusion generated at an interface between the upper layer 23 and the lower layer containing silicon and oxygen easily spreads over the upper layer 23. A thin film containing hafnium, silicon, and oxygen has low chemical resistance and cleaning resistance. In the upper layer 23 in which the mutual diffusion spreads entirely, chemical resistance and cleaning resistance are deteriorated. When the thickness of the upper layer 23 is 5 nm or more, the mutual diffusion over the entire upper layer 23 can be restrained, and the deterioration in chemical resistance and cleaning resistance of the upper layer 23 can be restrained.

The lower layer 22 preferably contains silicon and oxygen, and more preferably consists of silicon and oxygen. By minimizing presence of other elements that are bonded to silicon in the lower layer 22, a ratio of bonds of silicon and oxygen in the lower layer 22 can be significantly increased.

Therefore, a total content of silicon and oxygen in the lower layer 22 is preferably 90 atom % or more, more preferably 95 atom % or more, and still more preferably 98 atom % or more. In addition, from a viewpoint of, for example, being able to restraining diffusion of silicon into the upper layer 23, the content of oxygen in the lower layer 22 is preferably 50 atom % or more, more preferably 55 atom % or more, and still more preferably 60 atom % or more. A total content of the above elements (a noble gas, hydrogen, carbon, and the like) inevitably contained in the lower layer 22 is preferably 3 atom % or less.

The refractive index n of the lower layer 22 with respect to the exposure light is preferably 2.0 or less, and more preferably 1.8 or less. The refractive index n of the lower layer 22 is preferably 1.5 or more, and more preferably 1.52 or more. In contrast, the extinction coefficient k of the lower layer 22 with respect to the exposure light is expected to be smaller than those of the lowermost layer 21 and the upper layer 23, and is preferably less than 0.05, and more preferably 0.02 or less. This is for increasing the transmittance of the phase shift film 2 with respect to the exposure light.

From a viewpoint of chemical resistance and cleaning resistance of a pattern sidewall to be formed, the thickness of the lower layer 22 is preferably 5 nm or more, and more preferably 7 nm or more. In order to control the film thickness of the phase shift film 2 not to be large, the thickness of the lower layer 22 is preferably 30 nm or less, and more preferably 20 nm or less.

Similarly to the upper layer 23, the lowermost layer 21 in the present embodiment preferably contains hafnium and oxygen, and more preferably consists of hafnium and oxygen. In a case where the lowermost layer 21 contains hafnium and oxygen, specific matters regarding a preferable total content of hafnium and oxygen, a preferable content of oxygen, a refractive index n for the exposure light, and an extinction coefficient k for the exposure light are the same as those of the upper layer 23.

From a viewpoint of chemical resistance and cleaning resistance of a pattern sidewall to be formed, the thickness of the lowermost layer 21 is preferably 5 nm or more, and more preferably 6 nm or more. The thickness of the lowermost layer 21 is preferably 50 nm or less, and more preferably 40 nm or less.

Note that a material of the lowermost layer 21 is not limited to the above-described materials, and may be made of another material (for example, a transition metal silicide-based material, a SiN-based material, a chromium-based material, a tantalum-based material, or the like) in addition to or in place of hafnium and oxygen.

In the phase shift film 2, the thickness of the lowermost layer 21 is more preferably larger than the thickness of the upper layer 23. At the time of patterning of the phase shift film 2, in order to enhance perpendicularity of a pattern sidewall to be formed and the like, so-called over etching is performed, that is, dry etching is continued even after etching on the phase shift film 2 reaches a surface of the transparent substrate 1. In the over etching, the pattern sidewall, formed on the phase shift film 2, on the transparent substrate 1 side is mainly etched. The lower layer 22 contains silicon and oxygen, and an etching rate of the lower layer 22 for dry etching is lower than that of the lowermost layer 21. In a case where the lowermost layer 21 is thick, a ratio of the lowermost layer 21 is relatively high on the transparent substrate 1 side of the pattern sidewall of the phase shift film 2. In this case, it is easy to control the perpendicularity of the pattern sidewall of the phase shift film 2 by over etching.

The refractive index n and the extinction coefficient k of the thin film including the phase shift film 2 are not determined only by a composition of the thin film. A film density, a crystal state, and the like of the thin film are also factors that affect the refractive index n and the extinction coefficient k. Therefore, various conditions when a thin film is formed by reactive sputtering are adjusted, and the thin film is formed so as to have desired refractive index n and extinction coefficient k. In order to make the refractive index n and the extinction coefficient k of the phase shift film 2 fall within the above range, it is not limited to adjusting a ratio of a mixed gas of a noble gas and a reactive gas (an oxygen gas, a nitrogen gas, or the like) at the time of film formation by reactive sputtering. There are a variety of conditions such as a pressure in a film forming chamber, power applied to a sputtering target, and a positional relationship such as a distance between a target and the transparent substrate 1 when the film is formed by reactive sputtering. These film forming conditions are unique to a film forming apparatus, and are adjusted appropriately such that the thin film to be formed has a desired refractive index n and extinction coefficient k.

[Light-Shielding Film]

The mask blank 100 includes the light-shielding film 3 on the phase shift film 2. In general, in the phase shift mask, an outer peripheral region of a region in which a transfer pattern is formed (transfer pattern formation region) is expected to secure an optical density (OD) of a predetermined value or more such that a resist film on a semiconductor wafer is not affected by exposure light that has passed through the outer peripheral region when transfer is performed by exposure on the resist film using an exposure apparatus. The outer peripheral region of the phase shift mask preferably has OD of 2.8 or more, and more preferably has OD of 3.0 or more. As described above, the phase shift film 2 has a function of transmitting the exposure light with a predetermined transmittance, and it is difficult to secure an optical density of a predetermined value only with the phase shift film 2. Therefore, it is required to build up the light-shielding film 3 on the phase shift film 2 at a stage of manufacturing the mask blank 100 in order to secure an optical density that would otherwise be insufficient. With such a configuration of the mask blank 100, it is possible to manufacture a phase shift mask 200, in which an optical density of a predetermined value is secured in the outer peripheral region, by removing the light-shielding film 3 in a region in which a phase shift effect is to be used (basically, a transfer pattern formation region) in a course of manufacturing the phase shift mask 200 (refer to FIGS. 2A-2G).

Either a single-layer structure or a stack of two or more layers is applicable to the light-shielding film 3. The light-shielding film 3 having the single-layer structure and each layer of the light-shielding film 3 having the stack of two or more layers may have substantially the same composition in a thickness direction of the film or the layer, or may have a composition having a gradient in the thickness direction of the layer.

The mask blank 100 in the embodiment illustrated in FIG. 1 has a configuration in which the light-shielding film 3 is layered on the phase shift film 2 without another film interposed therebetween. The light-shielding film 3 in this configuration is required to be formed of a material having sufficient etching selectivity with respect to an etching gas used when a pattern is formed on the phase shift film 2. The light-shielding film 3 in this case is preferably formed of a material containing chromium. Examples of the material containing chromium that forms the light-shielding film 3 include chromium metal and a material containing chromium and one or more elements selected from oxygen, nitrogen, carbon, boron, and fluorine.

Generally, a chromium-based material is etched with a mixed gas of a chlorine-based gas and oxygen gas, but chromium metal has an etching rate that is not so high for this etching gas. In order to increase the etching rate for the etching gas of the mixed gas of the chlorine-based gas and the oxygen gas, the material for forming the light-shielding film 3 is preferably a material containing chromium and one or more elements selected from oxygen, nitrogen, carbon, boron, and fluorine. One or more elements out of molybdenum, indium, and tin may be contained in the material containing chromium that forms the light-shielding film 3. Containing one or more elements out of molybdenum, indium, and tin makes it possible to further increase the etching rate for the mixed gas of the chlorine-based gas and the oxygen gas.

When the hard mask film 4 described later is formed on the light-shielding film 3 and formed of a material containing chromium, the light-shielding film 3 may be formed of a material containing silicon. In particular, a material containing a transition metal and silicon has high light-shielding performance, and can reduce the thickness of the light-shielding film 3. Examples of the transition metal contained in the light-shielding film 3 include any one metal of molybdenum (Mo), tantalum (Ta), tungsten (W), titanium (Ti), chromium (Cr), nickel (Ni), vanadium (V), zirconium (Zr), ruthenium (Ru), rhodium (Rh), zinc (Zn), niobium (Nb), palladium (Pd), and the like, or an alloy of these metals. Examples of a metal element other than a transition metal element contained in the light-shielding film 3 include aluminum (Al), indium (In), tin (Sn), gallium (Ga), and the like.

In contrast, the light-shielding film 3 may have a structure in which a layer containing chromium and a layer containing a transition metal and silicon are layered in this order from the phase shift film 2 side. Specific matters of the materials of the layer containing chromium and the layer containing a transition metal and silicon in this case are the same as those in the case of the light-shielding film 3 described above.

[Hard Mask Film]

The hard mask film 4 is formed in contact with a surface of the light-shielding film 3. The hard mask film 4 is a film formed of a material having etching resistance to an etching gas used when the light-shielding film 3 is etched. It is sufficient that the hard mask film 4 has a film thickness enough to serve as an etching mask until dry etching for forming a pattern on the light-shielding film 3 is finished, and basically, the hard mask film 4 is not limited in an optical characteristic. Therefore, the hard mask film 4 can be made significantly thinner than the light-shielding film 3.

In a case where the light-shielding film 3 is formed of a material containing chromium, the hard mask film 4 is preferably formed of a material containing silicon. Note that, since the hard mask film 4 in this case tends to have low adhesion to a resist film of an organic material, it is preferable to perform a hexamethyldisilazane (HMDS) treatment on a surface of the hard mask film 4 to improve adhesion of the surface. Note that, the hard mask film 4 in this case is more preferably formed of $SiO_2$, SiN, SiON, or the like.

In addition to the above, a material containing tantalum is also applicable as the material of the hard mask film 4 in a case where the light-shielding film 3 is formed of a material containing chromium. Examples of the material containing tantalum in this case include tantalum metal and a material containing tantalum and one or more elements selected from nitrogen, oxygen, boron, and carbon, and the like. Examples of the material containing tantalum include Ta, TaN, TaO, TaON, TaBN, TaBO, TaBON, TaCN, TaCO, TaCON, TaBCN, TaBOCN, and the like. In a case where the light-shielding film 3 is formed of a material containing silicon, the hard mask film 4 is preferably formed of the above material containing chromium.

In the mask blank 100, a resist film of an organic material is preferably formed with a film thickness of 100 nm or less in contact with a surface of the hard mask film 4. In a case of a fine pattern corresponding to a DRAM hp 32 nm generation, a sub-resolution assist feature (SRAF) having a line width of 40 nm may be formed in a transfer pattern (phase shift pattern) to be formed on the hard mask film 4. However, even in this case, since a cross-sectional aspect ratio of a resist pattern can be made as low as 1:2.5, it is possible to suppress collapse and detachment of the resist pattern during development, rinsing, and the like of the resist film. Note that, the resist film more preferably has a film thickness of 80 nm or less.

[Resist Film]

In the mask blank 100, a resist film of an organic material is preferably formed with a film thickness of 100 nm or less in contact with a surface of the hard mask film 4. In a case of a fine pattern corresponding to a DRAM hp 32 nm generation, a sub-resolution assist feature (SRAF) having a line width of 40 nm may be formed in a light-shielding pattern to be formed on the light-shielding film 3. However, even in this case, by forming the hard mask film 4 as described above, the film thickness of the resist film can be reduced, and a cross-sectional aspect ratio of the resist pattern formed by this resist film can be made as low as 1:2.5. Therefore, it is possible to suppress collapse and detachment of the resist pattern during development, rinsing, and the like of the resist film. Note that, the resist film more preferably has a film thickness of 80 nm or less. The resist film is preferably a resist for electron beam drawing exposure, and more preferably a chemically amplified resist.

The phase shift film 2 in the mask blank 100 of the first embodiment can be patterned by a multi-stage dry etching treatment using a chlorine-based gas and a fluorine-based gas. The lowermost layer 21 and the upper layer 23 are preferably patterned by dry etching using a chlorine-based gas, and the lower layer 22 is preferably patterned by dry etching using a fluorine-based gas. Etching selectivity is significantly high between the lowermost layer 21 and the lower layer 22, and between the lower layer 22 and the upper layer 23. Although not particularly limited, by performing an etching treatment divided into multiple stages on the phase shift film 2 having the above-described characteristic, it is possible to suppress an influence of side etching and to obtain a good pattern cross-sectional shape.

In general, when a pattern is formed on a thin film by dry etching, additional etching (so-called over etching) for enhancing perpendicularity of a sidewall of the pattern formed on the thin film is performed. Over etching is often set on the basis of a time, as a reference, when etching reaches a lower surface of the thin film, a so-called just etching time. As described above, by applying the etching treatment divided into multiple stages to patterning of the phase shift film 2, the reference time for the over etching time can be set as the just etching time of the lowermost layer 21 of the phase shift film 2. As a result, the over etching time can be shortened, and good etching depth uniformity can be obtained. Here, the chlorine-based gas is preferably a chlorine-based gas containing boron, more preferably $BCl_3$ gas, and still more preferably a mixed gas of $BCl_3$ gas and $Cl_2$ gas.

Note that, although the phase shift film 2 having a three-layer structure has been described in the first embodiment, the contents of the present disclosure are not limited thereto. The phase shift film 2 may have a two-layer structure or a structure of four or more layers as long as the phase shift film 2 includes the above-described upper layer 23 and lower layer 22 and satisfies a desired transmittance, phase difference, and film thickness.

In addition, in the mask blank 100 in the embodiment 1, the phase shift film 2 is formed in contact with a surface of the transparent substrate 1, but the present disclosure is not limited thereto. For example, in a case where the phase shift film 2 includes two layers of the upper layer 23 and the lower layer 22, an etching stopper film may be formed between the transparent substrate 1 and the phase shift film 2. In this case, the etching stopper film is preferably formed of a material containing oxygen and one or more elements selected from aluminum, hafnium, chromium, and silicon. Examples of the material of the etching stopper film include a material containing aluminum, silicon, and oxygen, a material containing aluminum, hafnium, and oxygen, and the like. In particular, the etching stopper layer is preferably formed of a material containing aluminum, hafnium, and oxygen.

[Procedure of Manufacturing Mask Blank]

The mask blank 100 having the above configuration is manufactured by the following procedure. First, the transparent substrate 1 is prepared. The transparent substrate 1 is obtained by polishing an end surface and a main surface so to have a predetermined surface roughness (for example, in an inner region of a square having a side of 1 μm, root mean square roughness Sq is 0.2 nm or less), and then performing a predetermined cleaning treatment and drying treatment.

Next, on the transparent substrate 1, the phase shift film 2 is formed by a sputtering method in order from the lowermost layer 21 such that the lowermost layer 21, the lower layer 22, and the upper layer 23 have the above-described desired thicknesses, respectively. The lowermost layer 21, the lower layer 22, and the upper layer 23 in the phase shift film 2 are formed by sputtering, and it is possible to apply any sputtering such as DC sputtering, RF sputtering, or ion beam sputtering. In consideration of a film formation rate, it is preferable to apply the DC sputtering. In a case of using a target having low conductivity, it is preferable to apply RF sputtering or ion beam sputtering, and in consideration of the film formation rate, it is more preferable to apply RF sputtering.

As for the lowermost layer 21 and the upper layer 23 of the phase shift film 2, either a sputtering target containing hafnium or a sputtering target containing hafnium and oxygen can be applied.

As for the lower layer 22 of the phase shift film 2, either a sputtering target containing silicon or a sputtering target containing silicon and oxygen can be applied.

After the phase shift film 2 is formed, an annealing treatment at a predetermined heating temperature is performed appropriately. Next, the light-shielding film 3 described above is formed on the phase shift film 2 by a sputtering method. Then, the hard mask film 4 described above is formed on the light-shielding film 3 by the sputtering method. In film formation by the sputtering method, film formation is performed using a sputtering target containing materials forming each of the films described above at a predetermined composition ratio and a sputtering gas, and using the above-described mixed gas of a noble gas and a reactive gas as the sputtering gas as necessary. Thereafter, in a case where the mask blank 100 includes a resist film, a surface of the hard mask film 4 is subjected to a hexamethyldisilazane (HMDS) treatment as necessary. Then, a resist film is formed on the surface of the hard mask film 4 that has been subjected to the HMDS treatment by a coating method such as a spin coating method to complete the mask blank 100.

As described above, according to the mask blank 100 of the first embodiment, it is possible to manufacture the phase shift mask 200 that sufficiently satisfies required cleaning resistance and chemical resistance and has good optical performance.

<Phase Shift Mask and Method of Manufacturing the Same>

Figure 2A:
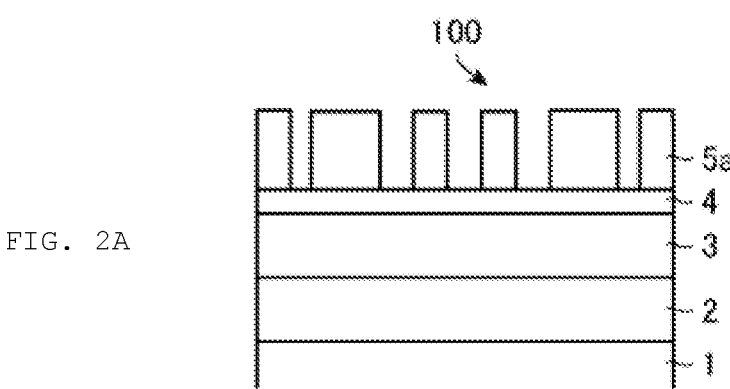

FIGS. 2A-2G illustrate the phase shift mask 200 according to the embodiment of the present disclosure, manufactured from the mask blank 100 of the above embodiment, and a process of manufacturing the phase shift mask 200. As illustrated in FIG. 2G, the phase shift mask 200 is characterized in that a phase shift pattern 2a that is a transfer pattern is formed on the phase shift film 2 of the mask blank 100, and a light-shielding pattern 3b having a pattern with a light shielding band is formed on the light-shielding film 3. The phase shift mask 200 has the same technical features as those of the mask blank 100. Matters regarding the transparent substrate 1, the lowermost layer 21 of the phase shift film 2, the lower layer 22 thereof, the upper layer 23 thereof, and the light-shielding film 3 in the phase shift mask 200 are the same as those of the mask blank 100. The hard mask film 4 is removed in the course of manufacture of the phase shift mask 200.

A method of manufacturing the phase shift mask 200 according to the embodiment of the present disclosure uses the mask blank 100 described above, and includes: a step of forming a transfer pattern on the light-shielding film 3 by dry etching; a step of forming a transfer pattern on the phase shift film 2 by dry etching using the light-shielding film 3 having the transfer pattern as a mask; and a step of forming the light-shielding pattern 3b on the light-shielding film 3 by dry etching using a resist film (resist pattern 6b) having a light-shielding pattern as a mask. Hereinafter, a method of manufacturing the phase shift mask 200 of the present disclosure will be described according to the manufacturing process illustrated in FIGS. 2A-2G. Note that, here, a method of manufacturing the phase shift mask 200 using the mask blank 100 in which the hard mask film 4 is layered on the light-shielding film 3 will be described. In addition, a case where a material containing chromium is applied to the light-shielding film 3 and a material containing silicon is applied to the hard mask film 4 will be described.

First, a resist film is formed in contact with the hard mask film 4 in the mask blank 100 by a spin coating method. Next, a first pattern that is a transfer pattern (phase shift pattern) to be formed on the phase shift film 2 is drawn by exposure with an electron beam on the resist film, and a predetermined treatment such as a development treatment is further performed to form a first resist pattern 5a having the phase shift pattern (refer to FIG. 2A). Subsequently, dry etching using a fluorine-based gas is performed using the first resist pattern 5a as a mask to form a first pattern (hard mask pattern 4a) on the hard mask film 4 (refer to FIG. 2B).

Figure 2B:
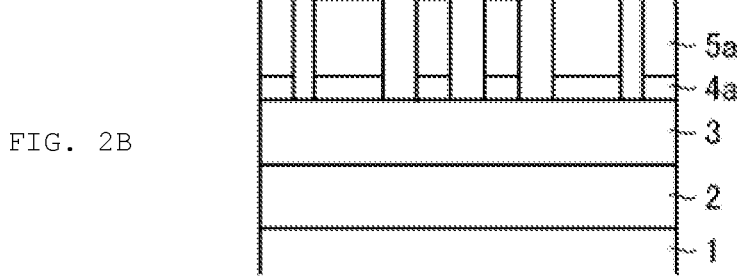
Figure 2C:
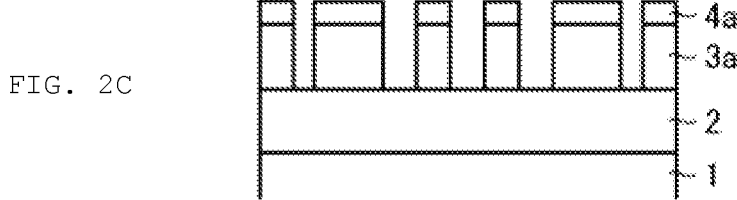

Next, the resist pattern 5a is removed, then a predetermined treatment such as cleaning using an acid or an alkali is performed, and then dry etching using a mixed gas of a chlorine-based gas and oxygen gas is performed using the hard mask pattern 4a as a mask to form a first pattern (light-shielding pattern 3a) on the light-shielding film 3 (refer to FIG. 2C). Subsequently, dry etching using a chlorine-based gas and dry etching using a fluorine-based gas are alternately performed three times using the light-shielding pattern 3a as a mask to form a first pattern (phase shift pattern 2a) on the phase shift film 2, and the hard mask pattern 4a is removed (refer to FIG. 2D). More specifically, dry etching using a chlorine-based gas is performed on the lowermost layer 21 and the upper layer 23, and dry etching using a fluorine-based gas is performed on the lower layer 22.

Next, a resist film was formed on the mask blank 100 by a spin coating method. Next, a second pattern that is a pattern (light-shielding pattern) to be formed on the light-shielding film 3 is drawn by exposure with an electron beam on the resist film, and predetermined treatment such as a development treatment is further performed to form a second resist pattern 6b having the light-shielding pattern (refer to FIG. 2E). Subsequently, dry etching using a mixed gas of a chlorine-based gas and oxygen gas is performed using the second resist pattern 6b as a mask to form a second pattern (light-shielding pattern 3b) on the light-shielding film 3 (refer to FIG. 2F). Furthermore, the second resist pattern 6b is removed, and then a predetermined treatment such as cleaning using an acid or an alkali is performed to obtain the phase shift mask 200 (refer to FIG. 2G).

The chlorine-based gas used in the dry etching described above is not particularly limited as long as the chlorine-based gas contains Cl. Examples thereof include $Cl_2$, $SiCl_2$, $CHCl_3$, $CH_2Cl_2$, $CCl_4$, $BCl_3$ and the like. The chlorine-based gas used in the dry etching for the lowermost layer 21 and the upper layer 23 described above preferably contains boron, and more preferably contains $BCl_3$. In particular, a mixed gas of $BCl_3$ gas and $Cl_2$ gas is preferable because the mixed gas has a relatively high etching rate for hafnium.

The phase shift mask 200 manufactured by the manufacturing method illustrated in FIGS. 2A-2G is a phase shift mask including the phase shift film 2 (phase shift pattern 2*a*) having a transfer pattern on the transparent substrate 1.

By manufacture the phase shift mask 200 as described above, the phase shift mask 200 that sufficiently satisfies required cleaning resistance and chemical resistance and has good optical performance can be obtained.

Then, an exposure margin can be secured when the phase shift mask 200 including a phase shift film is set in an exposure apparatus and exposure transfer is performed on a transfer target (such as a resist film on a semiconductor substrate).

In contrast, the etching process used in the above-described method of manufacturing a phase shift mask is not applicable only to the mask blank of the present disclosure, but also can be used in a wider range of applications. The etching process can also be applied when a transfer pattern is formed on a pattern-forming thin film in a mask blank including a pattern-forming thin film having a structure in which at least a layer containing oxygen and silicon and a layer containing hafnium and oxygen are layered in this order on a substrate. A method of manufacturing a transfer mask, which is a mode to which the above-described method of manufacturing a phase shift mask is applied, preferably has the following configuration.

That is, a method of manufacturing a transfer mask using a mask blank including a pattern-forming thin film on a substrate, the pattern-forming thin film having a structure in which
    a lower layer containing silicon and oxygen and an upper layer containing hafnium and oxygen are layered in this order from the substrate side, the method including:
    a step of performing dry etching using a boron-containing chlorine-based gas to form a transfer pattern on the upper layer; and
    a step of performing dry etching using a fluorine-based gas using the upper layer on which the transfer pattern is formed as a mask to form a transfer pattern on the lower layer.

Furthermore, the method of manufacturing a semiconductor device of the present disclosure includes a step of performing transferring, by exposure, a transfer pattern to a resist film on a semiconductor substrate using the phase shift mask 200 described above.

Since the phase shift mask 200 and the mask blank 100 of the present disclosure have the above-described effects, a transfer pattern can be transferred to a resist film on a semiconductor device with high CD in-plane uniformity (CD uniformity) when the phase shift mask 200 is set on a mask stage of an exposure apparatus using an ArF excimer laser as exposure light and the transfer pattern is transferred, by exposure, to the resist film on the semiconductor device. Therefore, in a case where a lower layer film below the resist film is dry-etched using the pattern of the resist film as a mask to form a circuit pattern, it is possible to form a highly accurate circuit pattern without a wiring short circuit or disconnection due to a decrease in CD in-plane uniformity.

EXAMPLES

Hereinafter, Example 1 and Comparative Example 1 for more specifically describing the embodiment of the present disclosure will be described.

Example 1

[Manufacture of Mask Blank]

Referring to FIG. 1, a transparent substrate 1 formed of synthetic quartz glass having a main surface dimension of about 152 mm×about 152 mm and a thickness of about 6.35 mm was prepared. End surfaces and main surfaces of the transparent substrate 1 were polished to have a predetermined surface roughness (Sq: 0.2 nm or less), and then subjected to a predetermined cleaning treatment and drying treatment. Each optical characteristic of the transparent substrate 1 was measured using a spectroscopic ellipsometer (M-2000D manufactured by J. A. Woollam Company). As a result, a refractive index and an extinction coefficient with respect to light having a wavelength of 193 nm were 1.556 and 0.000, respectively.

Next, the transparent substrate 1 was placed in a single wafer type RF sputtering apparatus, and the phase shift film 2 including the lowermost layer 21 made of hafnium and oxygen, the lower layer 22 made of silicon and oxygen, and the upper layer 23 made of hafnium and oxygen was formed on the transparent substrate 1 by sputtering (RF sputtering) with an argon (Ar) gas as a sputtering gas, alternately using an $HfO_2$ target and an $SiO_2$ target. The lowermost layer 21 had a thickness $D_1$ of 38 nm, the lower layer 22 had a thickness of 16 nm, and the upper layer 23 had a thickness of 5 nm, all of which are 5 nm or more. The phase shift film 2 had a thickness of 59 nm, which is 90 nm or less.

Next, the transparent substrate 1 on which the phase shift film 2 was formed was subjected to a heat treatment for reducing a film stress of the phase shift film 2. Using a phase shift amount measurement apparatus (MPM193 manufactured by Lasertec Corporation), a transmittance and a phase difference of the phase shift film 2 after the heat treatment with respect to light having a wavelength of 193 nm were measured. As a result, the transmittance and the phase difference were 40.9% and 177.2 degrees (deg), respectively. In addition, each optical characteristic of the phase shift film 2 was measured using a spectroscopic ellipsometer (M-2000D manufactured by J. A. Woollam Company). As a result, a refractive index n and an extinction coefficient k of the lowermost layer 21 and the upper layer 23 with respect to light having a wavelength of 193 nm were 2.93 and 0.24, respectively, and a refractive index n and an extinction coefficient k of the lower layer 22 were 1.56 and 0.00, respectively.

In addition, the content of oxygen in the upper layer 23 of the phase shift film 2 was 66 atom % or less, and oxygen deficiency occurred.

Next, the transparent substrate 1 on which the phase shift film 2 was formed was placed in a single wafer type RF sputtering apparatus, and reactive sputtering (RF sputtering) was performed in a mixed gas atmosphere of argon (Ar), carbon dioxide ($CO_2$), and helium (He) using a chromium (Cr) target. Thus, a light-shielding film (CrOC film) 3 formed of chromium, oxygen, and carbon was formed with a film thickness of 53 nm in contact with the phase shift film 2.

Next, the transparent substrate 1 on which the light-shielding film (CrOC film) 3 described above was formed was subjected to a heat treatment. After the heat treatment, for the transparent substrate 1 on which the phase shift film 2 and the light-shielding film 3 were layered, an optical density of the stack of the phase shift film 2 and the light-shielding film 3 at a wavelength (about 193 nm) of light of an ArF excimer laser was measured using a spectrophotometer (Cary 4000 manufactured by Agilent Technologies, Inc.). As a result, it was confirmed that the optical density was 3.0 or more.

Next, the transparent substrate 1 on which the phase shift film 2 and the light-shielding film 3 were layered was placed in a single wafer type RF sputtering apparatus, and a hard mask film 4 made of silicon and oxygen was formed with a thickness of 12 nm on the light-shielding film 3 by RF sputtering using a silicon dioxide ($SiO_2$) target and argon (Ar) gas as a sputtering gas. Furthermore, a predetermined cleaning treatment was performed to manufacture a mask blank 100 of Example 1.

[Cleaning Test (Chemical Resistance Test)]

In addition, the phase shift film of Example 1 was formed on another transparent substrate, subjected to a desired annealing treatment, and then subjected to a cleaning test (chemical resistance test). Specifically, the phase shift film of Example 1 was formed on another transparent substrate and subjected to an annealing treatment at 500° C. for 30 minutes. Then, the entire surface (surface and side surface) of the phase shift film of Example 1 was subjected to each of SC-1 cleaning (cleaning with ammonia/hydrogen peroxide water) and SPM cleaning (cleaning with sulfuric acid/hydrogen peroxide water) five times at predetermined time. A rinsing treatment with pure water was performed between the SC-1 cleaning and the SPM cleaning.

After this cleaning test was performed, presence or absence of film loss was observed for the surface and the side surface of the phase shift film of Example 1. As a result, film loss was hardly observed on both the surface and the side surface.

[Manufacture of Phase Shift Mask]

Next, using the mask blank 100 of Example 1, a halftone phase shift mask 200 of Example 1 was manufactured by the following procedure. First, a surface of the hard mask film 4 was subjected to an HMDS treatment. Subsequently, a resist film formed of a chemically amplified resist for electron beam drawing was formed with a film thickness of 80 nm in contact with the surface of the hard mask film 4 by a spin coating method. Next, a first pattern, which is a phase shift pattern to be formed on the phase shift film 2, was drawn on the resist film with an electron beam, and a predetermined development treatment and a cleaning treatment using an acid or an alkali were performed to form a resist pattern 5a having a first pattern (refer to FIG. 2A).

Next, dry etching using CF 4 gas was performed using the resist pattern 5a as a mask to form a first pattern (hard mask pattern 4a) on the hard mask film 4 (refer to FIG. 2B).

Next, the resist pattern 5a was removed. Subsequently, a cleaning treatment using an acid or an alkali was performed. Thereafter, dry etching using a mixed gas of chlorine gas ($Cl_2$) and oxygen gas ($O_2$) was performed using the hard mask pattern 4a as a mask to form a first pattern (light-shielding pattern 3a) on the light-shielding film 3 (refer to FIG. 2C).

Figure 2D:
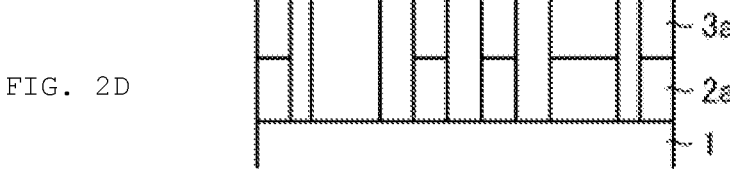

Next, dry etching was performed using the light-shielding pattern 3a as a mask to form a first pattern (phase shift pattern 2a) on the phase shift film 2, and at the same time, the hard mask pattern 4a was removed (refer to FIG. 2D). At this time, dry etching was performed on the lowermost layer 21 and the upper layer 23 using a mixed gas of $BCl_3$ gas and $Cl_2$ gas, and dry etching was performed on the lower layer 22 using dry etching using a fluorine-based gas (a mixed gas of SF 6 and He).

Next, a resist film formed of a chemically amplified resist for electron beam drawing was formed on the light-shielding pattern 3a with a film thickness of 150 nm by a spin coating method. Next, a second pattern, which is a pattern (pattern including a light-shielding band pattern) to be formed on the light-shielding film, was drawn by exposure on the resist film, and a predetermined treatment such as a development treatment was further performed to form a resist pattern 6b having the light-shielding pattern (refer to FIG. 2E). Subsequently, dry etching using a mixed gas of chlorine gas ($Cl_2$) and oxygen gas ($O_2$) was performed using the resist pattern 6b as a mask to form a second pattern (light-shielding pattern 3b) on the light-shielding film 3 (refer to FIG. 2F). Furthermore, the resist pattern 6b was removed, and then a predetermined treatment such as cleaning using an acid or an alkali was performed to obtain the phase shift mask 200 (refer to FIG. 2G).

A cross section of the phase shift pattern 2a in the phase shift mask 200 of Example 1 was observed. As a result, film loss was not observed on either the surface or the side surface of the phase shift pattern 2a, and the phase shift pattern 2a was good.

[Evaluation of Pattern Transfer Performance]

The phase shift mask 200 prepared through the above-described procedure was subjected to simulation of a transfer image at the time of exposure transfer to a resist film on a semiconductor device with exposure light of a wavelength of 193 nm using AIMS 193 (manufactured by Carl Zeiss AG). As a result of verification of an exposure transfer image of this simulation, the CD uniformity was high and a design specification was sufficiently satisfied. From this result, it can be said that a circuit pattern finally formed on the semiconductor device can be formed with high accuracy even when the phase shift mask 200 of Example 1 is set on a mask stage of an exposure apparatus and exposure transfer is performed to a resist film on the semiconductor device.

Comparative Example 1

[Manufacture of Mask Blank]

A mask blank of Comparative Example 1 was manufactured by a procedure which is same as that in Example 1 except for the film thickness of a phase shift film. The phase shift film of Comparative Example 1 was formed under different film forming conditions from those of the phase shift film 2 of Example 1. Specifically, a transparent substrate was placed in a single wafer type RF sputtering apparatus, and a phase shift film including a lowermost layer made of hafnium and oxygen, a lower layer made of silicon and oxygen, and an upper layer made of hafnium and oxygen was formed on the transparent substrate by sputtering (RF sputtering) with an argon (Ar) gas as a sputtering gas, alternately using an $HfO_2$ target and an $SiO_2$ target. The lowermost layer had a thickness of 42 nm, the lower layer had a thickness of 11 nm, the upper layer had a thickness of 4 nm, and the phase shift film had a thickness of 57 nm. As described above, the thickness of the upper layer of the phase shift film of Comparative Example 1 was less than 5 nm.

Using a phase shift amount measurement apparatus (MPM193 manufactured by Lasertec Corporation), a transmittance and a phase difference of the phase shift film with respect to light having a wavelength of 193 nm were measured. As a result, the transmittance and the phase difference were 40.9% and 177.2 degrees (deg), respectively. In addition, each optical characteristic of the phase shift film was measured using a spectroscopic ellipsometer (M-2000D manufactured by J. A. Woollam Company). As a result, a refractive index n and an extinction coefficient k of the lowermost layer and the upper layer with respect to light having a wavelength of 193 nm were 2.93 and 0.24, respectively, and a refractive index n and an extinction coefficient k of the lower layer were 1.56 and 0.00, respectively.

In addition, the content of oxygen in the upper layer of the phase shift film was 66 atom % or less, and oxygen deficiency occurred.

Next, a light-shielding film (CrOC film) formed of chromium, oxygen, and carbon was formed with a film thickness of 53 nm in contact with the phase shift film by the same procedure as that in Example 1. For the transparent substrate on which the phase shift film and the light-shielding film of Comparative Example 1 were layered, an optical density of the stack of the phase shift film and the light-shielding film at a wavelength (193 nm) of light of an ArF excimer laser was measured using a spectrophotometer (Cary 4000 manufactured by Agilent Technologies, Inc.). As a result, it was confirmed that the optical density was 3.0 or more.

[Cleaning Test (Chemical Resistance Test)]

In addition, the phase shift film of Comparative Example 1 was formed on another transparent substrate, subjected to a desired annealing treatment, and then subjected to a cleaning test (chemical resistance test). Specifically, the phase shift film of Comparative Example 1 was formed on another transparent substrate and subjected to an annealing treatment at 500° C. for 30 minutes. Then, the entire surface (surface and side surface) of the phase shift film of Comparative Example 1 was subjected to each of SC-1 cleaning (cleaning with ammonia/hydrogen peroxide water) and SPM cleaning (cleaning with sulfuric acid/hydrogen peroxide water) five times at predetermined time. A rinsing treatment with pure water was performed between the SC-1 cleaning and the SPM cleaning.

After this cleaning test was performed, presence or absence of film loss was observed for the surface and the side surface of the phase shift film of Comparative Example 1. As a result, significant film loss occurred on the surface and the side surface in an upper layer portion of the phase shift film.

[Manufacture and Evaluation of Phase Shift Mask]

Next, a phase shift mask of Comparative Example 1 was manufactured using the mask blank of Comparative Example 1 by the same procedure as that in Example 1. As a result, significant film loss occurred in a phase shift film at the time of forming a transfer pattern, and a phase shift mask having a desired characteristic could not be manufactured.

REFERENCE SIGNS LIST

1 Transparent substrate
2 Phase shift film
21 Lowermost layer
22 Lower layer
23 Upper layer
2a Phase shift pattern
3 Light-shielding film
3a, 3b Light-shielding pattern
4 Hard mask film
4a Hard mask pattern 5a Resist pattern
6b Resist pattern
100 Mask blank
200 Phase shift mask

The invention claimed is:

1. A mask blank comprising:
a transparent substrate; and
a phase shift film on the transparent substrate, wherein
the phase shift film includes a lower layer and an upper layer formed on the lower layer,
the upper layer is in contact with the lower layer,
the lower layer includes silicon and oxygen,
the upper layer includes hafnium and oxygen,
the upper layer has a thickness of 5 nm or more, and
the phase shift film has a thickness of 90 nm or less.

2. The mask blank according to claim 1, wherein a total content of hafnium and oxygen in the upper layer is 90 atom % or more.

3. The mask blank according to claim 1, wherein a total content of silicon and oxygen in the lower layer is 90 atom % or more.

4. The mask blank according to claim 1, wherein a content of oxygen in each of the lower layer and the upper layer is 50 atom % or more.

5. The mask blank according to claim 1, wherein
the phase shift film includes a lowermost layer between the transparent substrate and the lower layer,
the lowermost layer is in contact with the lower layer, and
the lowermost layer includes hafnium and oxygen.

6. The mask blank according to claim 5, wherein the lowermost layer has a thickness of 5 nm or more.

7. The mask blank according to claim 5, wherein a total content of hafnium and oxygen in the lowermost layer is 90 atom % or more.

8. The mask blank according to claim 5, wherein a content of oxygen in the lowermost layer is 50 atom % or more.

9. The mask blank according to claim 1, wherein the phase shift film transmits exposure light of an ArF excimer laser with a transmittance of 20% or more, and generates a phase difference of 150 degrees or more and 210 degrees or less with respect to the exposure light.

10. The mask blank according to claim 1, comprising a light-shielding film on the phase shift film.

11. A phase shift mask comprising:
a transparent substrate; and
a phase shift film formed on the transparent substrate and having a transfer pattern, wherein
the phase shift film includes a lower layer and an upper layer formed on the lower layer,
the upper layer is in contact with the lower layer,
the lower layer includes silicon and oxygen,
the upper layer includes hafnium and oxygen,
the upper layer has a thickness of 5 nm or more, and
the phase shift film has a thickness of 90 nm or less.

12. The phase shift mask according to claim 11, wherein a total content of hafnium and oxygen in the upper layer is 90 atom % or more.

13. The phase shift mask according to claim 11, wherein a total content of silicon and oxygen in the lower layer is 90 atom % or more.

14. The phase shift mask according to claim 11, wherein a content of oxygen in each of the lower layer and the upper layer is 50 atom % or more.

15. The phase shift mask according to claim 11, wherein the phase shift film includes a lowermost layer between the transparent substrate and the lower layer, the lowermost layer is in contact with the lower layer, and the lowermost layer includes hafnium and oxygen.

16. The phase shift mask according to claim 15, wherein the lowermost layer has a thickness of 5 nm or more.

17. The phase shift mask according to claim 15, wherein a total content of hafnium and oxygen in the lowermost layer is 90 atom % or more.

18. The phase shift mask according to claim 15, wherein a content of oxygen in the lowermost layer is 50 atom % or more.

19. The phase shift mask according to claim 11, wherein the phase shift film transmits exposure light of an ArF excimer laser with a transmittance of 20% or more, and generates a phase difference of 150 degrees or more and 210 degrees or less with respect to the exposure light.

20. The phase shift mask according to claim 11, comprising, a light-shielding film on the phase shift film, the light-shielding film having a light-shielding pattern.

\* \* \* \* \*